United States Patent [19]

Mawhinney et al.

[11] Patent Number: 4,613,832
[45] Date of Patent: Sep. 23, 1986

[54] FLUID FILLED MICROWAVE CAVITY OSCILLATOR FOR A DISCONTINUITY DETECTOR SYSTEM

[75] Inventors: Daniel D. Mawhinney, Livingston; Henry F. Milgazo, Brick, both of N.J.

[73] Assignee: RCA Corporation, Princeton, N.J.

[21] Appl. No.: 795,503

[22] Filed: Nov. 6, 1985

[51] Int. Cl.$^4$ .............................................. H03B 7/12
[52] U.S. Cl. .................................... 331/96; 331/65; 331/107 DP; 333/250; 324/236
[58] Field of Search .............. 331/65, 96, 107 DP, 331/117 D; 333/227, 231, 232, 250; 343/5 DD, 5 TM, 5 PD; 324/327, 329, 236; 340/552, 553

[56] References Cited

U.S. PATENT DOCUMENTS

| | | | |
|---|---|---|---|
| 3,624,555 | 11/1971 | Klein | 331/107 R |
| 4,053,897 | 10/1977 | Nerheim | 343/785 |
| 4,142,164 | 2/1979 | Nishikawa et al. | 333/73 W |
| 4,371,849 | 2/1983 | Longley | 331/96 |
| 4,475,089 | 10/1984 | Kahnke | 340/553 X |
| 4,494,085 | 1/1985 | Goldberg | 331/3 X |
| 4,495,478 | 1/1985 | Kwon et al. | 331/3 X |
| 4,521,746 | 6/1985 | Hwan et al. | 333/232 X |
| 4,567,437 | 1/1986 | Hubbard | 331/65 X |

Primary Examiner—Eugene R. LaRoche
Assistant Examiner—D. C. Mis
Attorney, Agent, or Firm—Joseph S. Tripoli; Robert L. Troike; Raymond E. Smiley

[57] ABSTRACT

A microwave cavity oscillator comprises a waveguide blocked at both ends, an active device enclosed in the waveguide and a dielectric powder or other fluid filling the remaining space in the waveguide. The microwave cavity oscillator is useful, for example, as in a discontinuity detector system.

5 Claims, 4 Drawing Figures

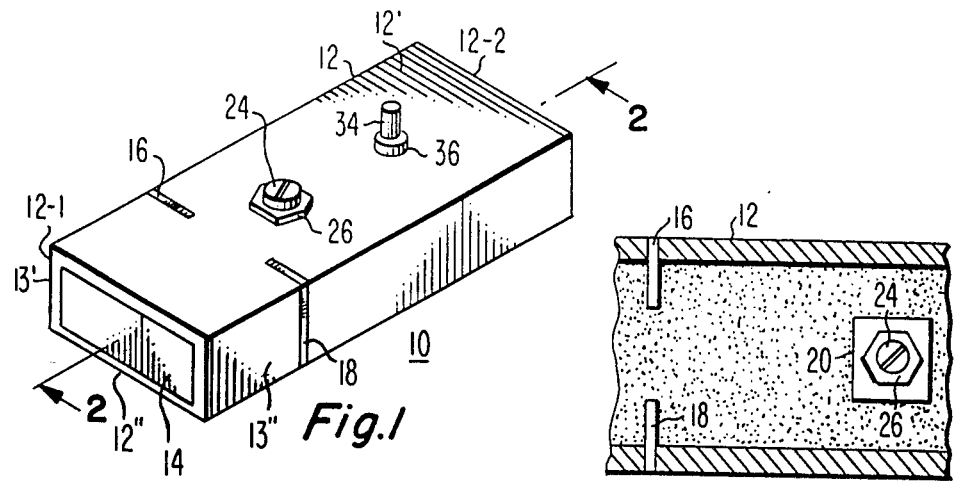
Fig.1
Fig.3
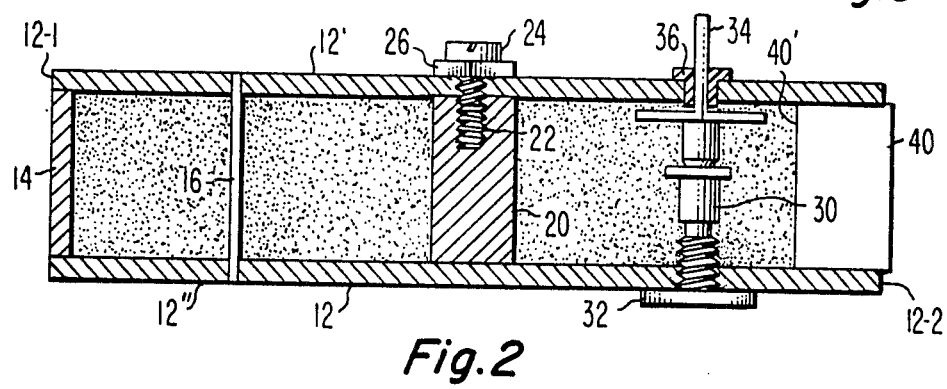
Fig.2
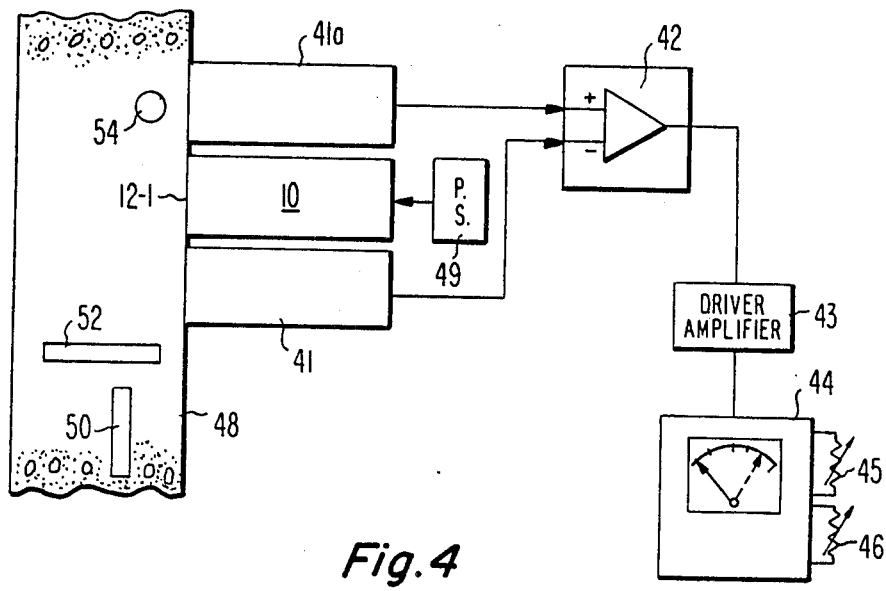
Fig.4

FLUID FILLED MICROWAVE CAVITY OSCILLATOR FOR A DISCONTINUITY DETECTOR SYSTEM

BACKGROUND OF INVENTION

1. Field of Invention

This invention relates to microwave cavity oscillators and more particularly with a cavity filled with a fluid.

2. Description of the Prior Art

In waveguides for microwave circuits it is known to fill the microwave cavity with a dielectric powder or solid dielectric to lower the cutoff frequency below that which the waveguide would have absent the dielectric powder. Thus it is possible to use a relatively small waveguide, which, other things being equal, has a higher cutoff frequency than does a larger waveguide and by filling it with a dielectric powder lower its cutoff frequency. It is known to position an oscillator diode in a nonfilled waveguide. It is not considered practical to utilize a solid dielectric within an internally mounted oscillator diode as, in the absence of a carefully machined dielectric, the resulting air space between the oscillator diode and dielectric would significantly affect the frequency and stability of the oscillator in an uncontrollable manner.

SUMMARY OF THE INVENTION

In accordance with the preferred embodiment with the present invention a microwave cavity oscillator comprising the combination of a section of hollow waveguide, having first and second ends, an oscillator circuit positioned in the waveguide, means blocking the first and second ends and a fluid having dielectric constant, which is high compared to that of air filling the entire waveguide and surrounding and touching the oscillator diode.

BRIEF DESCRIPTION OF THE DRAWING

FIG. 1 is a microwave cavity oscillator in perspective;

FIG. 2 is a cross section view along lines 2—2 of FIG. 1;

FIG. 3 is a broken away portion of the FIG. 1 oscillator with waveguide wall 12' thereof removed; and FIG. 4 illustrates a system for utilizing the microwave cavity oscillator of FIGS. 1, 2 and 3 as a discontinuity detector.

DETAILED DESCRIPTION OF A PREFERRED EMBODIMENT

FIG. 1 to which attention is now directed illustrates an overall view of a microwave cavity oscillator 10 in accordance with a preferred embodiment of the present invention and further illustrates where the cross section views of FIGS. 2 and 3 are taken. Cavity oscillator 10 comprises a section of conventional waveguide 12 having for example two opposed broad rectangular walls rectangular 12' and 12" spaced apart by two narrow rectangular side walls 13' and 13". A solid ceramic or plastic material 14 having a relatively high dielectric constant and low loss at the microwave frequency of interest such as Emerson & Cumming Stycast Hi-K Dielectric Stock functions as a cover at a first end 12-1 of waveguide 12, and also is transparent to microwave signals to be emanated therefrom as will be described hereafter.

Reference is next made to FIGS. 2 and 3. FIG. 2 is a cross section view along lines 2—2 of FIG. 1 and FIG. 3 is a partial top view of FIG. 1 with the top wall 12' of the waveguide 12 removed. In FIG. 2 near the left end of waveguide 12, i.e. near end 12-1, is illustrated one flat rectangular piece 16 of two rectangular pieces of metal (brass being an example) which together form an iris through which microwave energy may pass. The other flat rectangular piece 18 of metal forming the iris is illustrated in FIG. 1 and in FIG. 3. Physically the metal pieces 16 and 18 can be installed in waveguide 12 by first cutting thin slits in the waveguide sized to the thickness of pieces 16 and 18 and then inserting and soldering pieces 16 and 18 into place. These slits are cut through the side walls 13' and 13" and partly along the broad walls so when the plates are inserted there is a restriction in the width of the waveguide at the iris.

A rod 20 of low loss dielectric material, teflon being an example, is wedged into waveguide 12 between broad walls 12' and 12" respectively. Next a orifice is drilled through waveguide broad wall 12' and extending part way through rod 20 and the orifice is threadedly tapped as identified by legend 22. Typically, the orifice extends approximately one-third of the distance from wall 12' to wall 12". After rod 20 is tapped, a small screw 24 such as a number 2–50 is inserted first into a locknut 26 and then into the threaded orifice in rod 20. Tuning screw 24 is positioned in rod 20 to provide for an exact desired frequency of operation as will be hereinafter described and when adjusted is held in place by the tightening of locknut 26.

A microwave oscillator diode generally legended 30, is positioned in waveguide 12 with one end threaded secure to wall 12". Metal member 32 provides extra thickness for the threads. Oscillator diode 30 may be of the type described in "A Practical Guide to Microwave Semiconductor" Microwave Associates, Burlington, Mass., on pages 47, 48. A typical oscillator frequency is 5.6 GHZ. A typical oscillator diode is a continuous wave Gunn diode sold by M/A-CON type MA-49152. Oscillator diode 30 includes a bias pin 34 which projects through an opening of wall 12' of waveguide 12. The opening may be filled with a nonconductive material such as a teflon shoulder washer 36 to prevent the loss of a powder or other fluid to be hereinafter described.

Then a fluid having a high delectric constant relative to that of air such as dielectric powder illustrated as specks in FIGS. 2 and 3 is poured into the opened end 12-2. An exemplary powder is any one of nine standard Emerson & Cumming Eccflon Hi-K free-flowing dielectric powders having dielectric constant ranging from 2.5 to 12.00 with dissipation factors less than 0.0008 and bulk densities from 1.6 to 2.8 grams/cc. Because of the presence of elements 16, 18, 20 and 30 the powder is only added to waveguide 12 with great difficulty. As an aid to adding the powder, the waveguide 12 is ultrasonically vibrated to cause the powder to go into all of the cracks and crevices in waveguide 12. Other high dielectric constant fluids such as air could also be utilized.

Finally a block 40 which is sized to just fit into the waveguide 12 is inserted into end 12-2 to close off the end and seal in the power. Block 40 typically may be made of brass, and, in addition to sealing off end 12b, acts as a microwave short.

The location of metal pieces 16 and 18, tuning screw 24, oscillator diode 30 and the position of short end 40' along waveguide 12 are all chosen as follows.

The length of the microwave cavity in waveguide 12 which primarily determine the oscillator frequency is the distance from metal pieces 16 and 18 to the face 40' of the short end 40. Most conveniently this is made to be one-half wavelength long at the lowest oscillator frequency although it can be made longer in one-half wavelength intervals. The length is determined by computing the guide wavelength at the frequency of interest from well known wavelength formulas. For example, using the most common $TE_{1,0}$ propagation mode, the guide wavelength $$\lambda_g = \lambda_0 \div \sqrt{\epsilon - (\lambda/\lambda_c)^2}$$

where $\lambda_0$ is the free space wavelength and $\lambda_C$ is twice the width of the rectangular waveguide in consistent dimensions. The relative dielectric constant of the filling material is represented by the constant $\epsilon$. The portion of the oscillator diode 30 and the support structure (34, 32) is determined by its impedance. The Gunn diode (also known as transferred election device), which is used in the embodiment, is a low impedance generator and is mounted as close to the short circuit plane (40') as possible without contacting it. The position of the tuning mechanism (20, 24, 26) is not critical and is generally located at about the center of the structure for convenience and maxiumum tuning effect.

The metal pieces (16, 18) act as a pair to form an inductive iris determining how much power is coupled out of the oscillator cavity. If a small opening is left (that is piece 16 almost touching piece 18), only a small amount of power will leak out. If a large opening gap is allowed, coupling may be so heavy as to cause oscillations to be erratic or altogether inhibited as in any oscillator which is heavily loaded. Selection of the dimension can be done empirically or by calculating the susceptance of the iris formed by the metal pieces (16, 18). Design charts and nonographs, such as those formed in "Reference Data for Radio Engineers" $4^{th}$ edition, Page 631 are available for such calculations, FIG. 4 to which attention is now directed illustrates a system incorporating microwave cavity oscillator 10 to create a discontinuity detector. The discontinuity detector may be used, for example, to locate nails or screws in a gypsum wall or to locate metal reinforcing bars (rebars) in material such as concrete. When used in this manner, it is desirable to have a transmission path from the oscillator 10 into the wall 48 that is of a uniform dielectric constant. By using dielectric powder and solids of the same relative dielectric constant as the wall material, a uniform transmission characteristic can be obtained.

For locating rebars, their is a need for a uniform dielectric medium in the oscillator 10 to allow for direct coupling into concrete walls, for example. The dielectric constant of dry concrete is in the order of 6 and dielectric material for solid endpiece 14 and the dielectric powder are each chosen to be of the same value, thus minimizing the discontinuity and reflection at the interface between the oscillator cavity 10 and the concrete wall 48 when used as a probe against the wall.

When used in this manner, materials such as rebars within the wall can be detected using an arrangement shown in FIG. 4 to which attention is now directed. Item 41 is a waveguide structure similar to the dielectric filled cavity oscillator 10 (FIG. 1) in which a detector diode such as a Hewlett-Packard type HSCH 3206 diode is used in place of the oscillator Gunn diode and acts as a receiver. Metal pieces 16, 18 are not utilized. In one working embodiment two receivers 41 and 41a, one positioned on each side of the oscillator 10 for better balance and discrimination of vertical bars such as 50 as against horizontal bars such as 52 and 54. A biasing power supply 49 is coupled to oscillator 10 specifically to bias pin 34 thereof (FIG. 1). The output of each detector 41 and 41a is coupled to − and + inputs, respectively, of an integrated circuit difference amplifier 42, the output of which is coupled to a driver or power amplifier 43. The output of amplifier 43 is coupled to a simple analog microammeter with sensitivity and offset adjustment devices 45, 46. Deflection of the meter as the assembly, consisting of elements 10, 41, 41a is passed along a material containing rebars, indicates the presence of a microwave reflection from an irregularity in the concrete wall such as from rebars 50-54. The system also quite readily detects nails and metal or wood studs in conventional plasterboard wall construction.

What is claimed is:

1. A microwave cavity oscillator comprising, in combination:

a section of hollow waveguide, having first and second ends;

an active device positioned in the waveguide;

means for closing off said first and second ends; and a fluid with a dielectric constant which is high compared to that of air filling the entire waveguide and surrounding and touching said active device.

2. The combination as set forth in claim 1 wherein said fluid comprises a dielectric powder.

3. The combination as set forth in claim 1 and further including means extending inward from two opposing walls of said waveguide forming an iris.

4. The combination as set forth in claim 3 further including means extending between two opposing walls of said waveguide for tuning said waveguide to oscillate at a particular frequency.

5. A system for detecting a discontinuity in a material comprising in combination:

a microwave cavity oscillator adapted to be positioned near said material for emitting a given frequency signal toward said material;

a microwave frequency receiver positioned proximate said microwave cavity oscillator for receiving a signal reflected from said material at said given frequency and producing an output signal proportional to the level of said signal reflected thereto; and means responsive to said output signal for displaying differences in signal power associated with the presence or absence of a discontinuity in said material.

* * * * *